United States Patent
Han et al.

(10) Patent No.: US 7,345,338 B1
(45) Date of Patent: Mar. 18, 2008

(54) BULB-SHAPED RECESS GATE OF A SEMICONDUCTOR DEVICE AND METHOD FOR FABRICATING THE SAME

(75) Inventors: Ky-Hyun Han, Ichon-shi (KR); Ki-Won Nam, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/645,735

(22) Filed: Dec. 27, 2006

(30) Foreign Application Priority Data

Sep. 29, 2006 (KR) .................. 10-2006-0096525

(51) Int. Cl.
*H01L 29/94* (2006.01)
*H01L 21/302* (2006.01)
*H01L 21/336* (2006.01)

(52) U.S. Cl. .................. 257/330; 257/332; 438/259; 438/270

(58) Field of Classification Search ........ 257/330–334; 438/259, 270, 271, 589
See application file for complete search history.

(56) References Cited

U.S. PATENT DOCUMENTS

| | | | |
|---|---|---|---|
| 2006/0289931 A1* | 12/2006 | Kim et al. .............. | 257/330 |
| 2007/0052013 A1* | 3/2007 | Kim et al. .............. | 257/330 |
| 2007/0105388 A1* | 5/2007 | Lee et al. .............. | 438/710 |
| 2007/0200169 A1* | 8/2007 | Kim .................... | 257/330 |
| 2007/0224763 A1* | 9/2007 | Fujimoto et al. ........ | 438/259 |

FOREIGN PATENT DOCUMENTS

| | | |
|---|---|---|
| KR | 10-2000-0060693 | 10/2000 |
| KR | 10-2002-0055938 | 7/2002 |
| KR | 10-2006-0023308 | 3/2006 |
| KR | 10-2006-0058959 | 6/2006 |

* cited by examiner

*Primary Examiner*—Cuong Nguyen
(74) *Attorney, Agent, or Firm*—Finnegan, Henderson, Farrabow, Garrett, & Dunner, L.L.P.

(57) ABSTRACT

A recess gate of a semiconductor device includes: a substrate having a bulb-shaped recess pattern formed therein, wherein the bulb-shaped recess pattern includes a first ball pattern and a second ball pattern formed therein, the first ball pattern having a different diameter than the second ball pattern; a gate insulation layer formed over the bulb-shaped recess pattern and the substrate; and a conductive layer formed over the gate insulation layer and filling the bulb-shaped recess pattern.

19 Claims, 13 Drawing Sheets

V2

V5

BULB-SHAPED RECESS GATE OF A SEMICONDUCTOR DEVICE AND METHOD FOR FABRICATING THE SAME

CROSS-REFERENCE TO RELATED APPLICATIONS

The present invention claims the benefit of priority to Korean patent application number 10-2006-0096525, filed on Sep. 29, 2006, which is incorporated by reference in its entirety.

BACKGROUND

The present invention relates to a semiconductor device and a method for fabricating the same; and more particularly, to a bulb-shaped recess gate and a method for fabricating the same.

Typically, a recess gate of a semiconductor device is considered as a special structure which cannot be excluded from the fabrication of the semiconductor device. The recess gate increases electric properties including a threshold voltage, and a refresh time which may be generated due to a decreased channel area of a gate as a device pattern becomes densified. The recess gate also increases a length of the gate undergoing a gate patterning process, resulting in an increased channel area, thereby improving a device property.

However, as a device size has been reduced, patterns become smaller and a distance between the devices becomes reduced. Accordingly, it is required to increase the channel area.

Recently, a bulb-shaped recess gate increasing the channel area by increasing an area of a bottom portion of the recess gate has been suggested.

FIG. 1 illustrates a typical method for fabricating a bulb-shaped recess gate.

A bulb-shaped recess pattern 12 includes a neck pattern 12A and a ball pattern 12B, both formed over a substrate 11.

A gate oxide layer 13 is formed over surfaces of bulb-shaped recess pattern 12 and substrate 11. Then, a polysilicon layer 14 filling bulb-shaped recess pattern 12, and used as a gate electrode, is formed over gate oxide layer 13.

As for bulb-shaped recess pattern 12, during forming polysilicon layer 14 which is the gate electrode, the inside of neck pattern 12A is filled with polysilicon layer 14 before ball pattern 12B is filled with the polysilicon layer 14. As a result, a void V1 may be generated.

FIGS. 2A and 2B are micrographs illustrating a void V2 typically generated during forming a polysilicon layer.

Void V2 generated during the formation of the polysilicon layer does not typically affect a device property. However, if a width of a neck pattern of a bulb-shaped recess gate is small while that of a ball pattern of the bulb-shaped recess gate is large, a size of void V2 may be increased. The increased size of void V2 may then reduce a thickness of the polysilicon layer. Thus, an electric property of the device may be decreased.

A method for increasing the width of the neck pattern may be suggested to reduce the size of void V2. However, increasing the width of the neck pattern reduces an overlay margin between the neck pattern and a gate electrode formed over the neck pattern, thereby producing a mis-alignment, resulting in difficulties in device fabrication.

SUMMARY

Embodiments consistent with the present invention provide a bulb-shaped recess gate capable of minimizing a size of a void, usually generated inside a ball pattern of a bulb-shaped recess pattern, during formation of a polysilicon layer and a method for fabricating the same.

Consistent with the present invention, there is provided a recess gate of a semiconductor device, including: a substrate having a bulb-shaped recess pattern formed therein, wherein the bulb-shaped recess pattern includes a first ball pattern and a second ball pattern formed therein, the first ball pattern having a different diameter than the second ball pattern; a gate insulation layer formed over the bulb-shaped recess pattern and the substrate; and a conductive layer formed over the gate insulation layer and filling the bulb-shaped recess pattern.

Further consistent with the present invention, there is provided a method for fabricating a recess gate of a semiconductor device, including: forming a bulb-shaped recess pattern in a substrate, wherein forming the bulb-shaped recess pattern comprises: forming a first ball pattern to have a first diameter in the substrate; and forming a second ball pattern to have a second diameter in the substrate; forming a gate insulation layer over the bulb-shaped recess pattern and the substrate; and forming a conductive layer over the gate insulation layer such that the conductive layer fills the bulb-shaped recess pattern.

DETAILED DESCRIPTION

According to embodiments consistent with the present invention which will be explained hereinafter, when a bulb-shaped recess gate is formed, a top portion of a neck pattern has substantially the same line width as that of the typical neck pattern. However, a bottom portion of the neck pattern contacting a ball pattern is formed in a large ball-shape to facilitate the formation of polysilicon. As a result, a bulb-shaped recess gate pattern can be formed in a gourd-shape.

A void cannot be generated in a region where the ball pattern and the neck pattern meet during the formation of the polysilicon. As a result, a size of the void can be reduced, thereby increasing an area of polysilicon and uniformly maintaining the line width of the top portion of the neck pattern. Accordingly, an overlay margin between the neck pattern and a gate electrode is not reduced.

Figure 3:
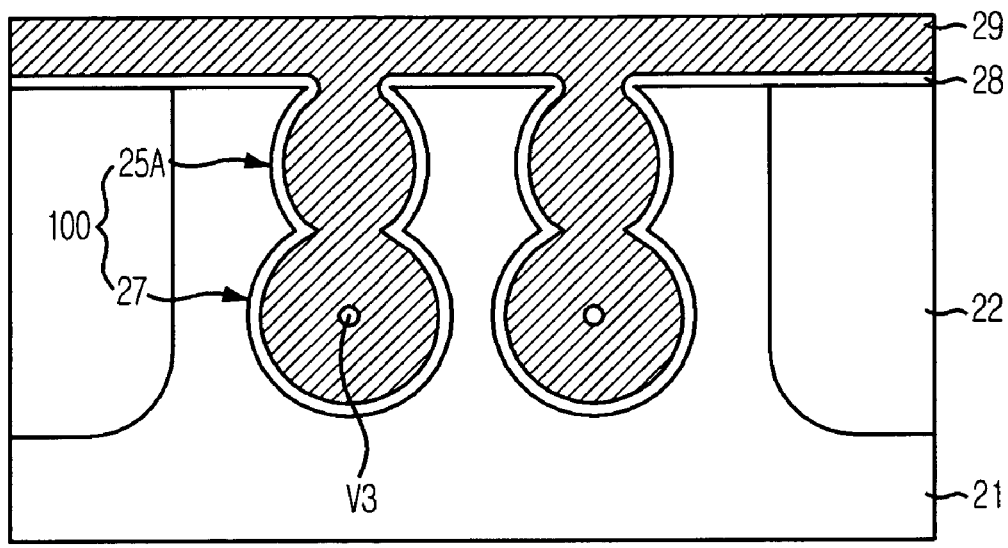
FIG. 3 illustrates a bulb-shaped recess gate in accordance with a first embodiment consistent with the present invention.

FIG. 3 illustrates a bulb-shaped recess gate in accordance with a first embodiment consistent with the present invention.

A plurality of bulb-shaped recess patterns 100, each including a first ball pattern 25A and a second ball pattern 27 are formed in a silicon substrate 21. A gate oxide layer 28 is formed over surfaces of bulb-shaped recess patterns 100 and silicon substrate 21.

A polysilicon layer 29 is then formed to fill the inside of bulb-shaped recess patterns 100.

The shapes and diameters of first ball pattern 25A and second ball pattern 27 may be different from each other. For example, first ball pattern 25A may have an elliptical shape while second ball pattern 27 may have a shape similar to a sphere. The diameter of first ball pattern 25A may be smaller than that of second ball pattern 27. Depths of first ball pattern 25A and second ball pattern 27 may be approximately the same with each other. Both of first ball pattern 25A and second ball pattern 27 are formed to the depths ranging from approximately 200 Å to approximately 500 Å.

Accordingly, bulb-shaped recess patterns 100, each including first ball pattern 25A and second ball pattern 27 are formed in gourd-shapes. Since first ball pattern 25A, constituting a neck portion of corresponding bulb-shaped recess pattern 100, is formed in an elliptical shape, polysilicon layer 29 fills the inside of second ball pattern 27 such that a small sized void V3 is produced.

FIGS. 4A to 4F illustrate a method for fabricating a bulb-shaped recess gate in accordance with the first embodiment consistent with the present invention. Herein, the same reference numerals used in FIG. 3 are also used to denote the same elements in FIGS. 4A to 4F.

Figure 4A:
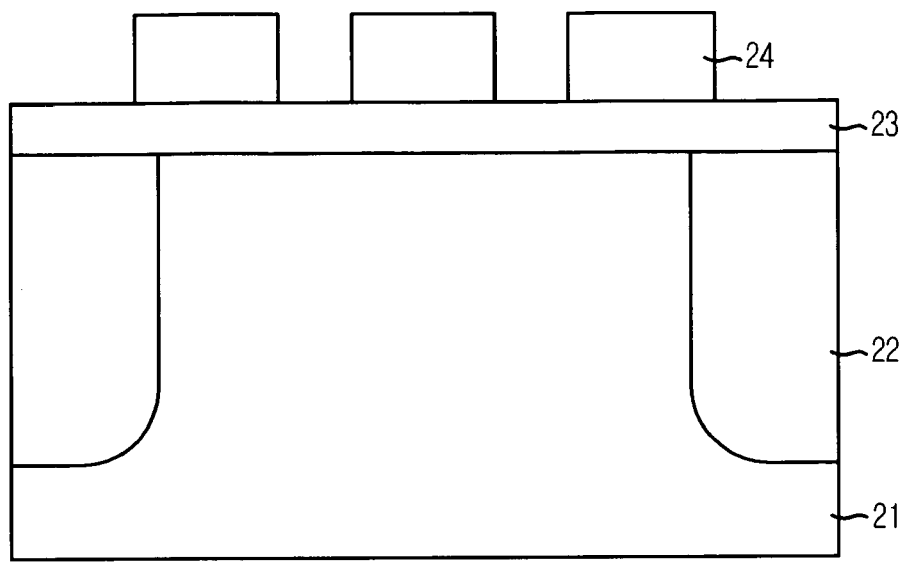
FIGS. 4A to 4F illustrate a method for fabricating the bulb-shaped recess gate in accordance with the first embodiment.

As shown in FIG. 4A, trenches are formed in a silicon substrate 21. Then, an oxide layer fills the trenches to form a plurality of field oxide layers 22. Field oxide layers 22 may be formed from a high density plasma oxide.

A hard mask layer 23 is formed over silicon substrate 21. A photoresist layer is formed over hard mask layer 23. Then the photoresist layer is patterned, and a photo-exposure process and a developing process are performed thereon to form a recess gate mask 24. The hard mask layer 23 may include polysilicon.

Figure 4B:
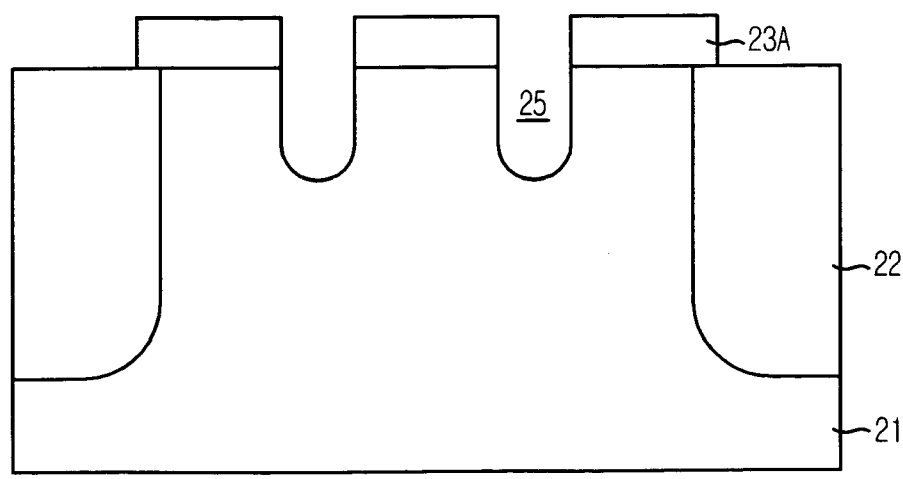

As shown in FIG. 4B, hard mask layer 23 is etched using recess gate mask 24 as an etch barrier. A reference numeral 23A denotes a hard mask pattern. Since hard mask layer 23 includes polysilicon, hydrogen bromide (HBr), chlorine ($Cl_2$), or a combination thereof may be used as an etch gas when the hard mask layer 23 is etched.

After hard mask layer 23 is etched, exposed portions of silicon substrate 21 are etched to certain depths using the same etch gas used to etch hard mask layer 23. As a result, a plurality of first neck patterns 25 of bulb-shaped recess patterns are formed. Depths of first neck patterns 25 range from approximately 200 Å to approximately 500 Å, and widths of first neck patterns 25 range from approximately 100 Å to approximately 200 Å. The etching process to form first neck patterns 25 includes performing a plasma etch using a mixture gas of HBr and $Cl_2$. A flow rate of the HBr gas ranges from approximately 30 sccm to approximately 150 sccm, and a flow rate of the $Cl_2$ gas ranges from approximately 10 sccm to approximately 60 sccm.

When the formation of first neck patterns 25 is completed, recess gate mask 24 is removed. Accordingly, the hard mask pattern 23A serves a role as an etch barrier.

First neck patterns 25 have vertically shaped sidewalls. However, according to this embodiment consistent with the present invention, the following method is used to transform the vertically shaped sidewalls of first neck patterns 25 to bulb-shaped sidewalls to increase widths of the sidewalls of first neck patterns 25.

Figure 4C:
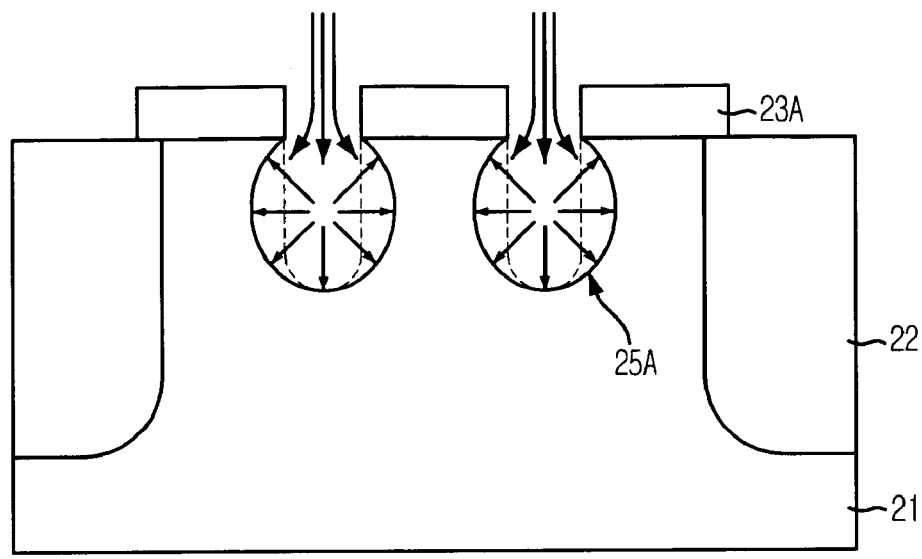

As shown in FIG. 4C, after first neck patterns 25 having the vertically shaped sidewalls are formed, an isotropic etching process is additionally performed. The isotropic etching process is performed in-situ in the same chamber used to form first neck patterns 25. For instance, the etching process to form first neck patterns 25 and the isotropic etching process may be performed using an inductively coupled plasma (ICP) type apparatus.

According to this embodiment consistent with the present invention, the isotropic etching process includes using a power ranging from approximately 1 W to approximately 20 W, and a mixture gas of tetrafluoromethane ($CF_4$), oxygen ($O_2$), and helium (He) as an etch gas. A flow rate of the $CF_4$ gas ranges from approximately 20 sccm to approximately 80 sccm. A flow rate of the $O_2$ gas ranges from approximately 5 sccm to approximately 10 sccm. A flow rate of the He gas ranges from approximately 100 sccm to approximately 200 sccm.

If the isotropic etching process is performed using a power ranging from approximately 1 W to approximately 20 W, a characteristic of an isotropic etch in which a radical chemically etches a surface, can be increased more than that of an etch in which an ion etches a surface in a straight line manner. Accordingly, the isotropic etch changes the vertically shaped sidewalls of first neck patterns 25 to elliptically shaped sidewalls of first neck patterns 25.

As the sidewalls of first neck patterns 25 are formed into elliptical shapes, surface areas of first neck patterns 25 are increased to form second neck patterns 25A. Inside portions of second neck patterns 25A have surface areas larger than top portions thereof. Accordingly, second neck patterns 25A formed performing the isotropic etching process is transformed into a ball pattern formed with a smooth curved line similar to a subsequent ball pattern. Hereinafter, second neck patterns 25A will be referred to as first ball patterns 25A. If the isotropic etching process is performed to form first ball patterns 25A, line widths of the top portions of the first ball patterns 25A can be maintained to be about the same as those of the top portions of first neck patterns 25. As a result, an overlay margin between first ball patterns 25A and a subsequent gate electrode is not reduced.

Figure 4D:
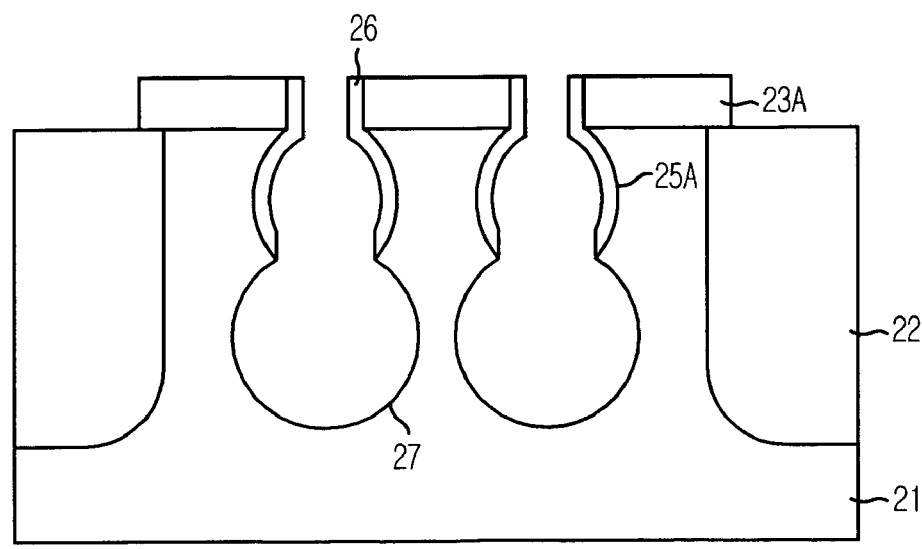

As shown in FIG. 4D, passivation sidewalls 26 are formed over the sidewalls of first ball patterns 25A. Passivation sidewalls 26 may comprise an oxide layer formed through a thermal oxidation process, an oxide layer formed through a deposition process, a nitride layer, or a nitride layer containing a large amount of silicon is formed to a depth ranging from approximately 50 Å to approximately 100 Å. Then, certain portions thereof are etched to remain only on the sidewalls of first ball patterns 25A. Passivation sidewalls 26 protect the sidewalls of first ball patterns 25A from being damaged during a subsequent etching process.

Bottom surfaces of first ball patterns 25A are subjected to an isotropic etching process to form a plurality of second ball patterns 27 having sphere-shaped sidewalls. The isotropic etching process includes using the above described conditions. Second ball patterns 27 have sizes, i.e., diameters, larger than those of first ball patterns 25A. Depths of second ball patterns 27 may be larger than or the same as those of first ball patterns 25A. For instance, both of first ball patterns 25A and second ball patterns 27 may be formed to a depth ranging from approximately 200 Å to approximately 500 Å. Since the line widths of the vertically shaped first neck patterns 25 range from approximately 100 Å to approximately 200 Å, the diameters of first ball patterns 25A range from approximately 300 Å to approximately 500 Å, and the diameters of second ball patterns 27 range from approximately 500 Å to approximately 700 Å.

Figure 4E:
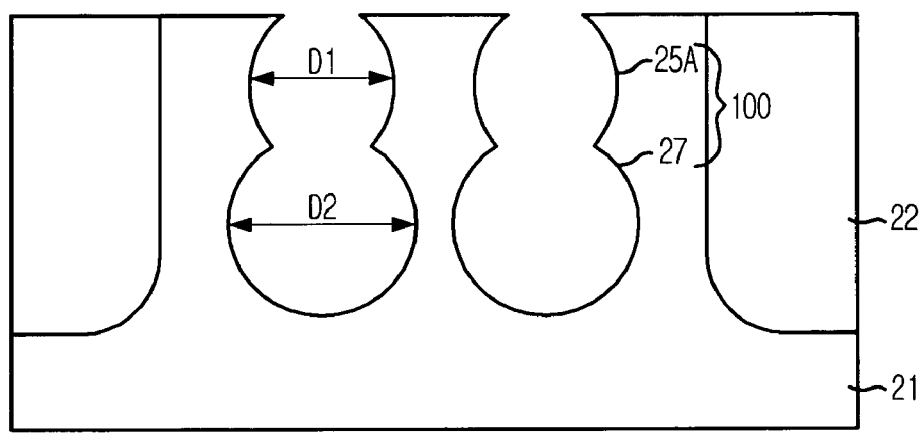

As shown in FIG. 4E, hard mask pattern 23A and passivation sidewalls 26 are removed.

After hard mask pattern 23A and passivation sidewalls 26 are removed, bulb-shaped recess patterns 100 including first ball patterns 25A and second ball patterns 27 are formed. As described above, first ball patterns 25A and second ball patterns 27 have different shapes and diameters from each other. Reference letter D1 denotes the diameter of each of first ball patterns 25A, and reference letter D2 denotes the diameter of each of second ball patterns 27. As shown, diameter D2 of second ball pattern 27 is larger than D1 of first ball pattern 25A, i.e., D2>D1. As a result, bulb-shaped recess gate patterns 100 can have large surface areas. Particularly, because first ball patterns 25 are formed in an elliptical shape, bulb-shaped recess patterns 100 according to this embodiment consistent with the present invention have surface areas which are larger than the typical bulb-shaped recess pattern. As described above, bulb-shaped recess patterns 100 including first ball patterns 25A and second ball patterns 27 have different shapes and diameters from each other, and thus can be formed in gourd-shapes.

The top portions of first ball patterns 25A of bulb-shaped recess patterns 100 maintain the line width initially defined and thus, an overlay margin between first ball patterns 25A and a subsequent gate electrode cannot be reduced.

Figure 4F:
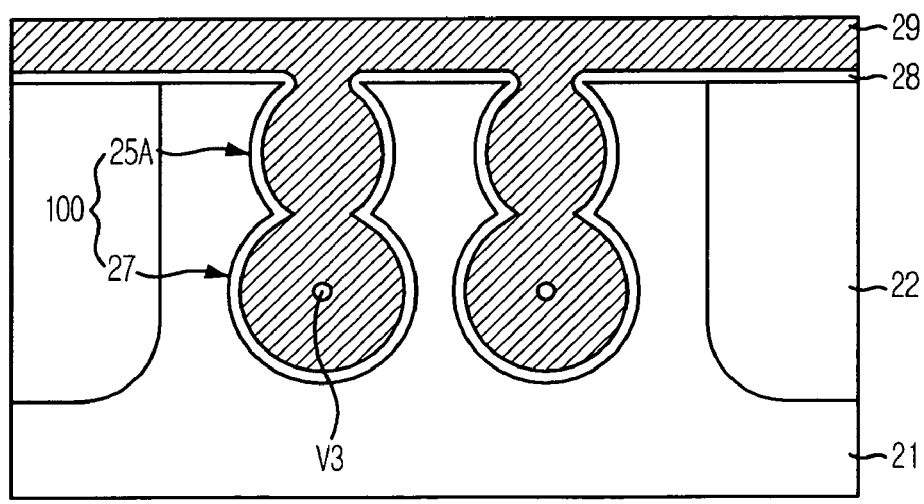

As shown in FIG. 4F, a gate oxide layer 28 is formed over surfaces of bulb-shaped recess patterns 100. Then, a polysilicon layer 29 used as a gate electrode is formed over an entire surface of the above resulting structure until bulb-shaped recess patterns 100 are filled.

During the formation of polysilicon layer 29, void generation may be minimized by first ball patterns 25A of bulb-shaped recess patterns 100 formed in the gourd-shape. Although polysilicon layer 29 is formed until the inside of second ball patterns 27 is completely filled, the top portions of bulb-shaped recess patterns 100 cannot be blocked by first ball patterns 25A having the increased sizes. As a result, a size of a void V3 is minimized.

First ball patterns 25A formed in elliptical shapes increases an area of the polysilicon layer 29, thereby increasing a channel length.

Although not shown, a tungsten silicide layer and a gate hard mask nitride layer are formed over polysilicon layer 29 and then, a gate patterning process is performed.

Figure 5:
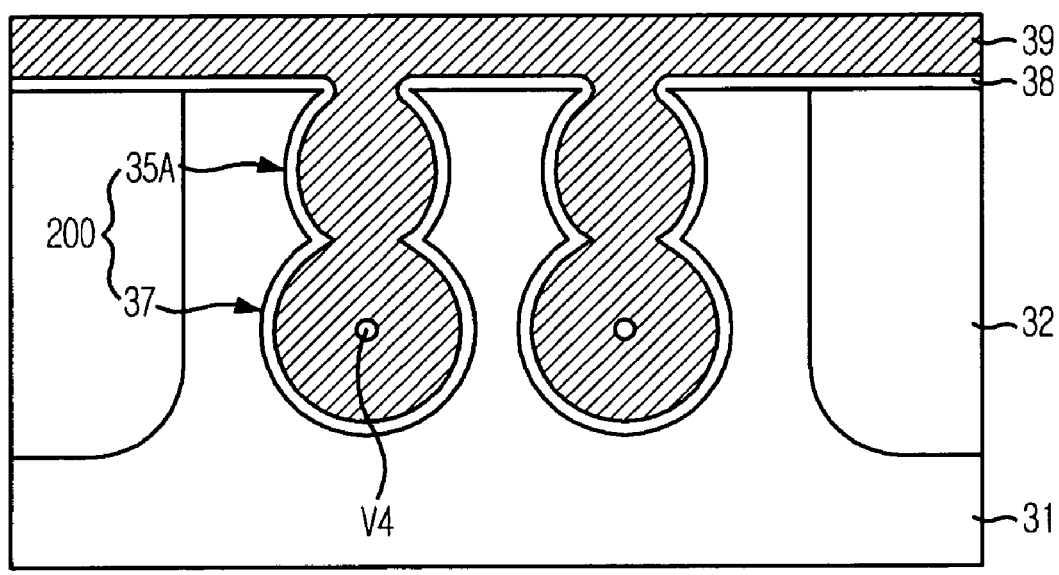
FIG. 5 illustrates a bulb-shaped recess gate in accordance with a second embodiment consistent with the present invention.

FIG. 5 illustrates a bulb-shaped recess gate in accordance with a second embodiment consistent with the present invention.

A plurality of bulb-shaped recess patterns 200, each including a first ball pattern 35A and a second ball pattern 37 are formed in a silicon substrate 31. A gate oxide layer 38 is formed over surfaces of bulb-shaped recess patterns 200 and silicon substrate 31.

A polysilicon layer 39 fills the inside of bulb-shaped recess patterns 200.

Shapes and diameters of first ball pattern 35A and second ball pattern 37 may be different from each other. For example, first ball pattern 35A has an elliptical shape while second ball pattern 37 has a shape similar to a sphere. The diameter of first ball pattern 35A may be smaller than that of second ball pattern 37. Depths of first ball pattern 35A and the second ball pattern 37 may be the same.

Accordingly, bulb-shaped recess patterns 200, each including first ball pattern 35A and second ball pattern 37 are formed in gourd-shapes. Since first ball pattern 35A is formed into an elliptical shape, a polysilicon layer 39 can fill the inside of second ball pattern 37 and only produce a small sized void V4.

FIGS. 6A to 6F illustrate a method for fabricating a bulb-shaped recess gate in accordance with the second embodiment consistent with the present invention. Herein, the same reference numerals used in FIG. 5 are also used to denote the same elements in FIGS. 6A to 6F.

Figure 6A:
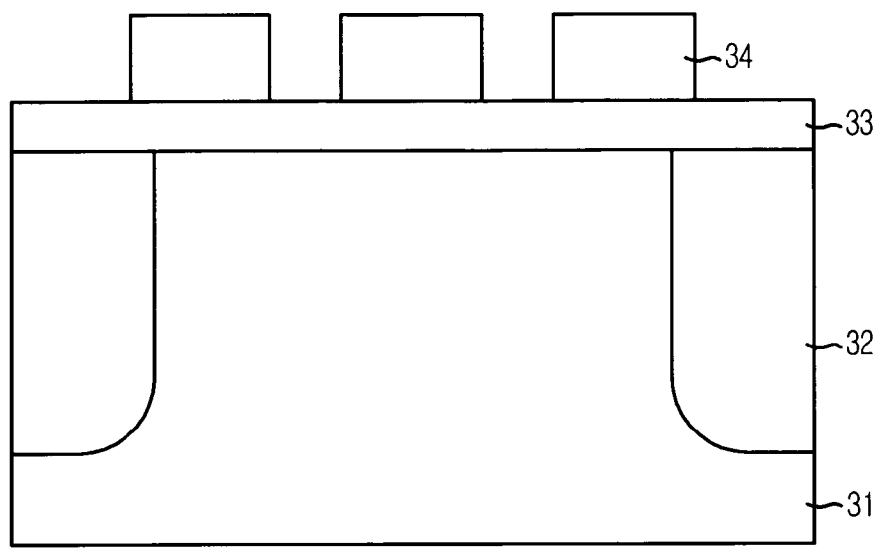
FIGS. 6A to 6F illustrate a method for fabricating the bulb-shaped recess gate in accordance with the second embodiment.

As shown in FIG. 6A, trenches are formed in a silicon substrate 31. Then, an oxide layer fills the trenches to form a plurality of field oxide layers 32. Field oxide layers 32 may be formed of a high density plasma oxide.

A hard mask layer 33 is formed over silicon substrate 31. A photoresist layer is formed over hard mask layer 33. Then, the photoresist layer is patterned, and a photo-exposure process and a developing process are performed thereon to form a recess gate mask 34. Hard mask layer 33 may include polysilicon.

Figure 6B:
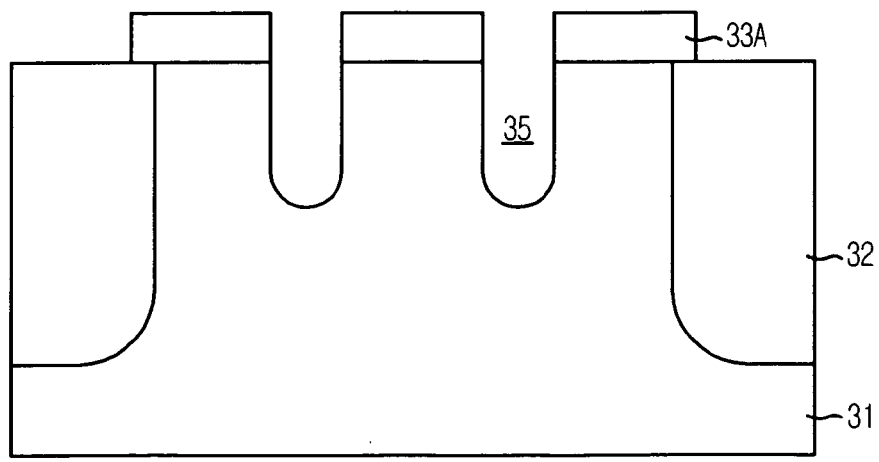

As shown in FIG. 6B, hard mask layer 33 is etched using recess gate mask 34 as an etch barrier. Reference numeral 33A denotes a hard mask pattern. Since hard mask layer 33 includes polysilicon, hydrogen bromide (HBr), chlorine ($Cl_2$), or a combination thereof may be used as an etch gas when hard mask layer 33 is etched.

After hard mask layer 33 is etched, exposed portions of silicon substrate 31 are etched to certain depths using the same etch gas used to etch hard mask layer 33. As a result, a plurality of first neck patterns 35 of bulb-shaped recess patterns are formed. Depths of first neck patterns 35 range from approximately 200 Å to approximately 500 Å, and widths of first neck patterns 35 range from approximately 100 Å to approximately 200 Å. The etching process to form first neck patterns 35 includes performing a plasma etch using a mixture gas of HBr and $Cl_2$. A flow rate of the HBr gas ranges from approximately 30 sccm to approximately 150 sccm, and a flow rate of the $Cl_2$ gas ranges from approximately 10 sccm to approximately 60 sccm.

When the formation of first neck patterns 35 is completed, recess gate mask 34 is removed. Accordingly, hard mask pattern 33A serves a role as an etch barrier in a subsequent etch process.

First neck patterns 35 have vertically shaped sidewalls. However, according to this embodiment consistent with the present invention, the following method is used to transform the vertically shaped sidewalls of first neck patterns 35 to ball-shaped sidewalls to increase widths of the sidewalls of first neck patterns 35.

Figure 6C:
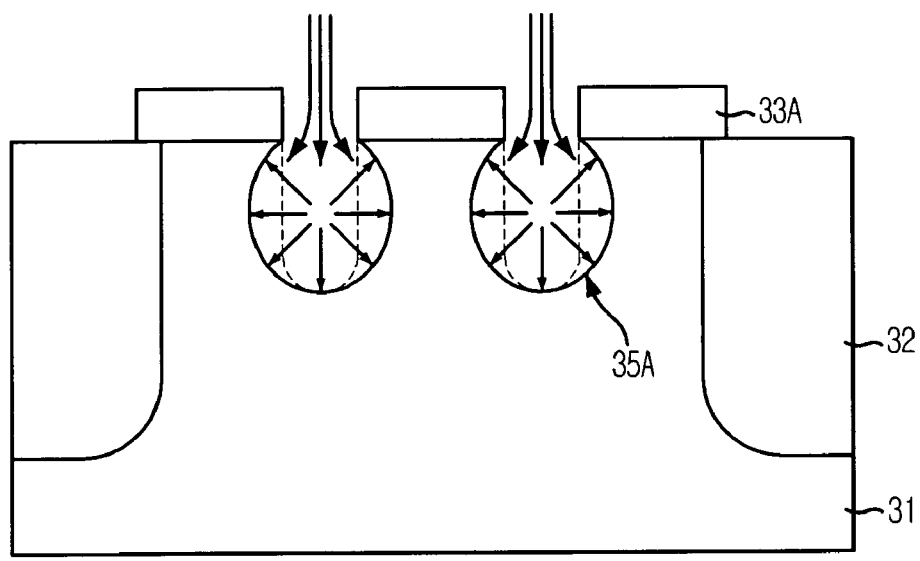

As shown in FIG. 6C, after first neck patterns 35 having the vertically shaped sidewalls are formed, an isotropic etching process is additionally performed. The isotropic etching process is performed in a chamber different from that used to form first neck patterns 35. For example, first neck patterns 35 may be etched by using an inductively coupled plasma (ICP) type apparatus.

According to this embodiment consistent with the present invention, the isotropic etching process includes using a microwave dry etching apparatus. A mixture gas of tetrafluoromethane ($CF_4$), oxygen ($O_2$), and helium (He) is used as an etch gas during the isotropic etching process. A flow rate of the $CF_4$ gas ranges from approximately 20 sccm to approximately 80 sccm. A flow rate of the $O_2$ gas ranges from approximately 5 sccm to approximately 10 sccm. A flow rate of the He gas ranges from approximately 100 sccm to approximately 200 sccm. A microwave power rages from approximately 500 W to approximately 2,500 W. If the isotropic etching process includes using the microwave dry etching apparatus, the microwave removes an ion from a plasma which contributes to the etching of a surface in a straight line. As a result, the ion cannot reach bottom portions of first neck patterns 35 but a chemical etch (e.g., radicals) may be used to perform the isotropic etching process.

As the sidewalls of first neck patterns 35 are formed into elliptical shapes, surface areas of first neck patterns 35 are increased to form second neck patterns 35A. Inside portions of second neck patterns 35A have surface areas larger than top portions thereof. Accordingly, second neck patterns 35A formed by performing the isotropic etching process is transformed to a ball pattern formed with a smooth curved line similar to a subsequent ball pattern. Hereinafter, second neck patterns 35A will be referred to as first ball patterns 35A. If the isotropic etching process is performed to form first ball patterns 35A, line widths of the top portions of the first ball patterns 35A may be the same as those of the top portions of first neck patterns 35. As a result, an overlay margin between the first ball patterns 35A and a subsequent gate electrode is not be reduced.

Figure 6D:
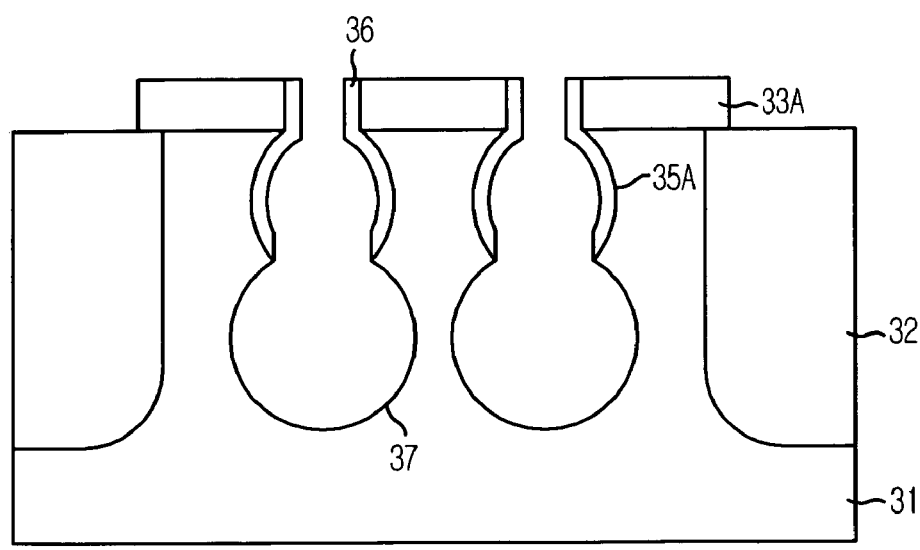

As shown in FIG. 6D, passivation sidewalls 36 are formed over the sidewalls of first ball patterns 35A. Passivation sidewalls 36 may include an oxide layer formed through a thermal oxidation process, an oxide layer formed through a deposition process, a nitride layer, or a nitride layer containing a large amount of silicon, and may be formed to a depth ranging from approximately 50 Å to approximately 100 Å. Then, certain portions thereof are etched to remain only on the sidewalls of first ball patterns 35A. Passivation sidewalls 36 protect the sidewalls of first ball patterns 35A from being damaged during a subsequent etching process.

Bottom surfaces of first ball patterns 35A are subjected to an isotropic etching process to form second ball patterns 37. The isotropic etching process includes using the above described conditions. Second ball patterns 37 have sizes, i.e., diameters and depths larger than those of first ball patterns 35A. Depths of second ball patterns 37 are larger than or the same as those of first ball patterns 35A. For example, both of first ball patterns 35A and the second ball patterns 37 may be formed to depths ranging from approximately 200 Å to approximately 500 Å. Since the line widths of the vertically shaped first neck patterns 35 range from approximately 100 Å to approximately 200 Å, the diameters of first ball patterns 35A range from approximately 300 Å to approximately 500 Å, and the diameters of second ball patterns 37 range from approximately 500 Å to approximately 700 Å.

Figure 6E:
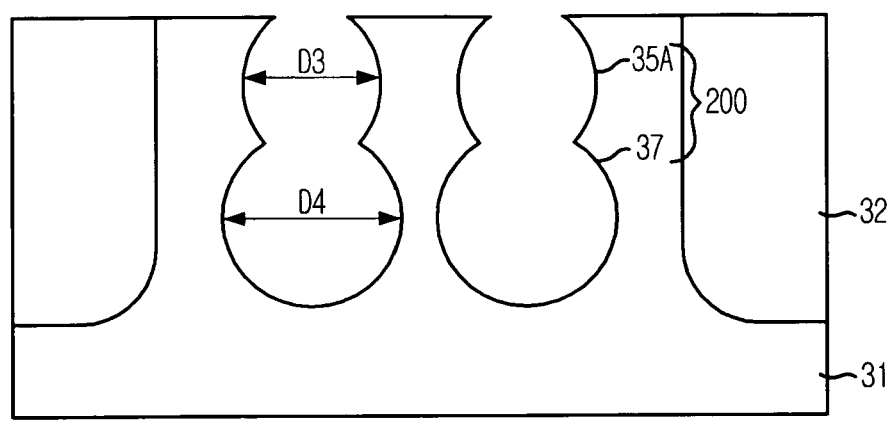

As shown in FIG. 6E, hard mask pattern 33A and passivation sidewalls 36 are removed.

After hard mask pattern 33A and passivation sidewalls 36 are removed, bulb-shaped recess patterns 200 including first ball patterns 35A and second ball patterns 37 are formed. As described above, first ball patterns 35A and second ball patterns 37 have different shapes and diameters from each other. Reference letter D3 denotes the diameter of each of first ball patterns 35A, and reference letter D4 denotes the diameter of each of second ball patterns 37. As shown, diameter D4 of second ball pattern 37 is larger than diameter D3 of first ball pattern 35A, i.e., D4>D3. As a result, bulb-shaped recess gate patterns 200 can have large surface areas. Particularly, because first ball patterns 35 are formed in an elliptical shape, bulb-shaped recess patterns 200 according to this embodiment consistent with the present invention have surface areas larger than the typical bulb-shaped recess pattern. As described above, bulb-shaped recess patterns 200 including first ball patterns 35A and second ball patterns 37 may have the different shapes and diameters from each other, and can be formed in gourd-shapes.

The top portions of first ball patterns 35A of bulb-shaped recess patterns 200 maintain the line widths initially defined and thus, an overlay margin between first ball patterns 35A and a subsequent gate electrode cannot be reduced.

Figure 6F:
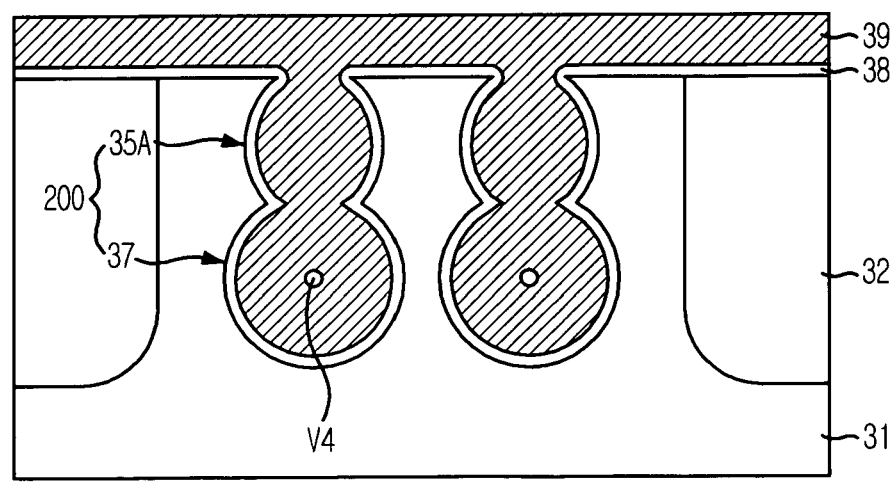

As shown in FIG. 6F, a gate oxide layer 38 is formed over surfaces of bulb-shaped recess patterns 200. Then, a polysilicon layer 39 used as a gate electrode is formed over an entire surface of the above resulting structure until bulb-shaped recess patterns 200 are filled.

During the formation of polysilicon layer 39, void generation can be minimized by first ball patterns 35A of bulb-shaped recess patterns 200. Although polysilicon layer 39 is formed until the inside of second ball patterns 37 are completely filled, the top portions of bulb-shaped recess patterns 200 can not be blocked by first ball patterns 35A with the increased sizes. As a result, a size of a void V4 can be minimized.

First ball patterns 35A formed in the elliptical shapes thus increase an area of polysilicon layer 39, thereby more increasing a channel length.

Although not shown, a tungsten silicide layer and a gate hard mask nitride layer are formed over polysilicon layer 39 and then, a gate patterning process is performed.

Figure 7A:
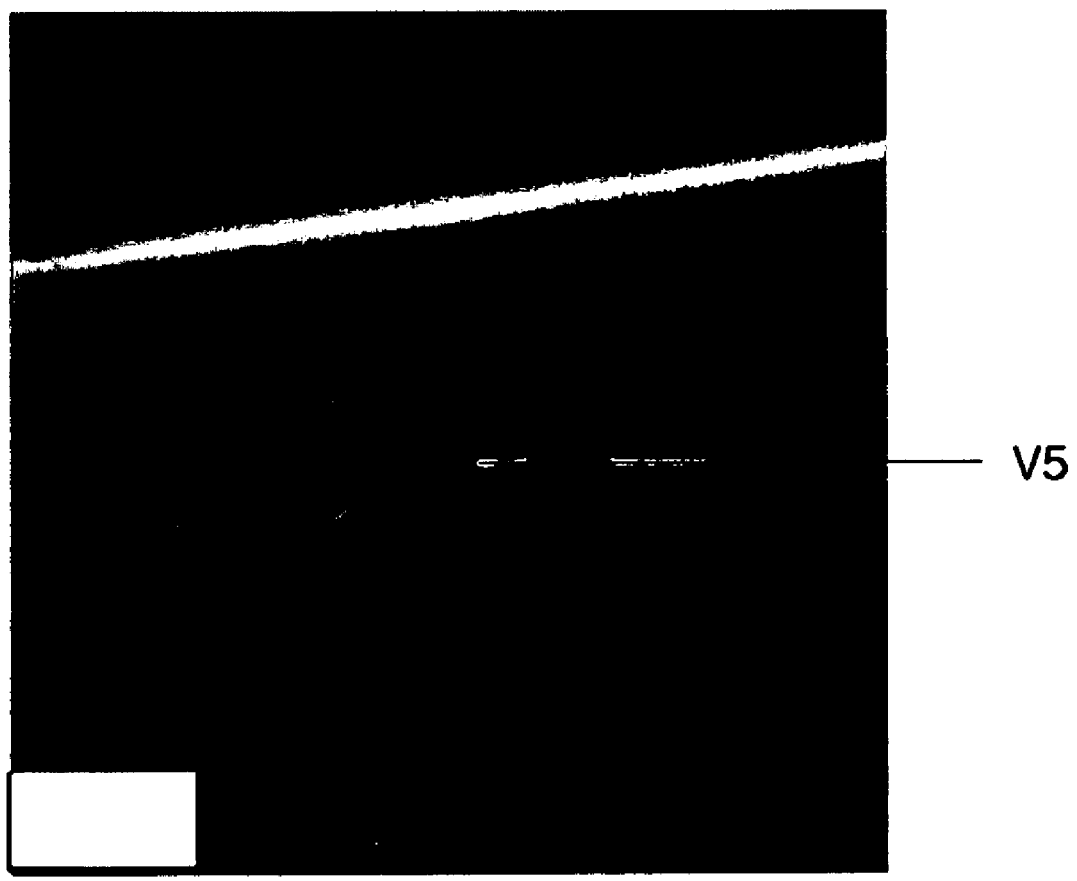
FIGS. 7A and 7B are micrographs illustrating the bulb-shaped recess pattern in accordance with the first and second embodiments consistent with the present invention and a result obtained forming a polysilicon layer.
Figure 7B:
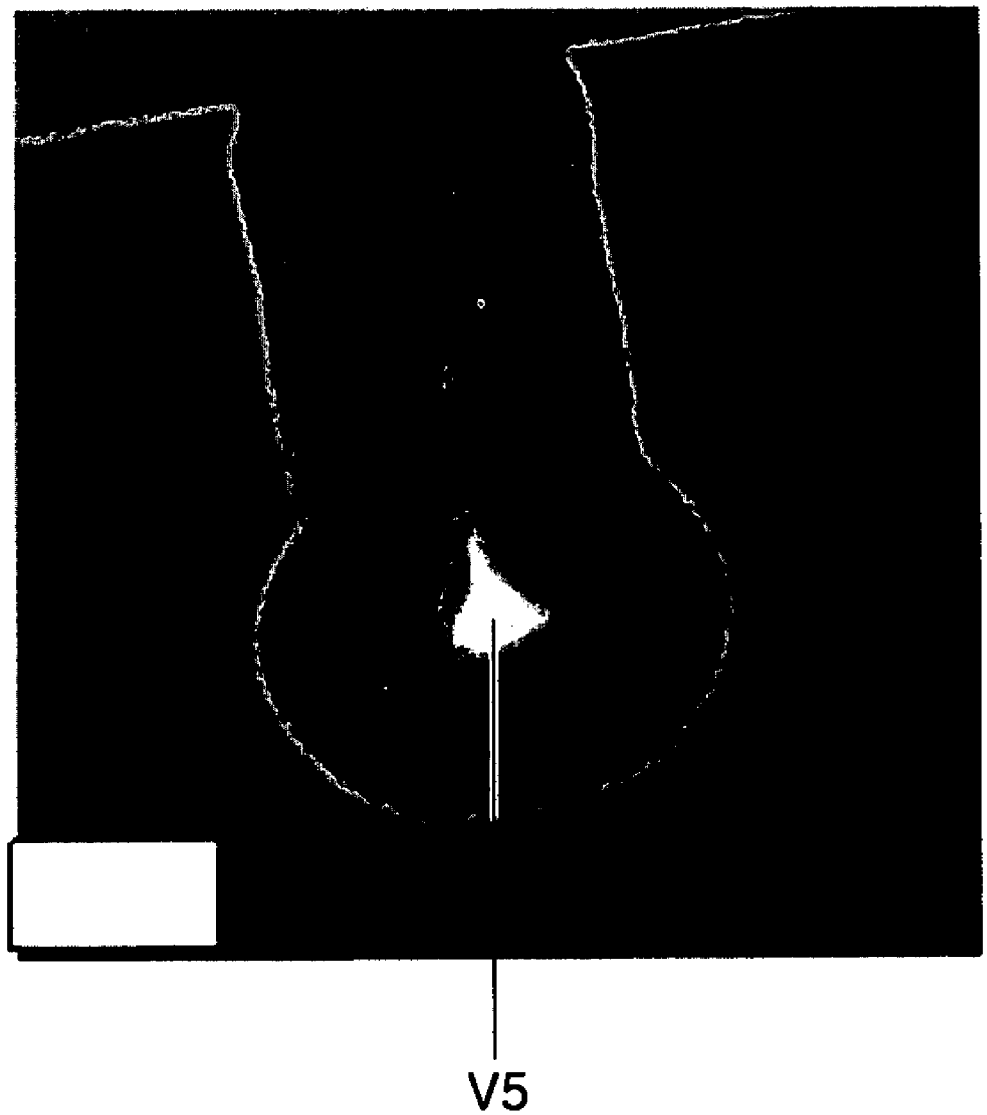

FIGS. 7A and 7B are micrographs illustrating the bulb-shaped recess pattern according to the first and second embodiments of the present invention and a result obtained forming a polysilicon layer.

Figure 1:
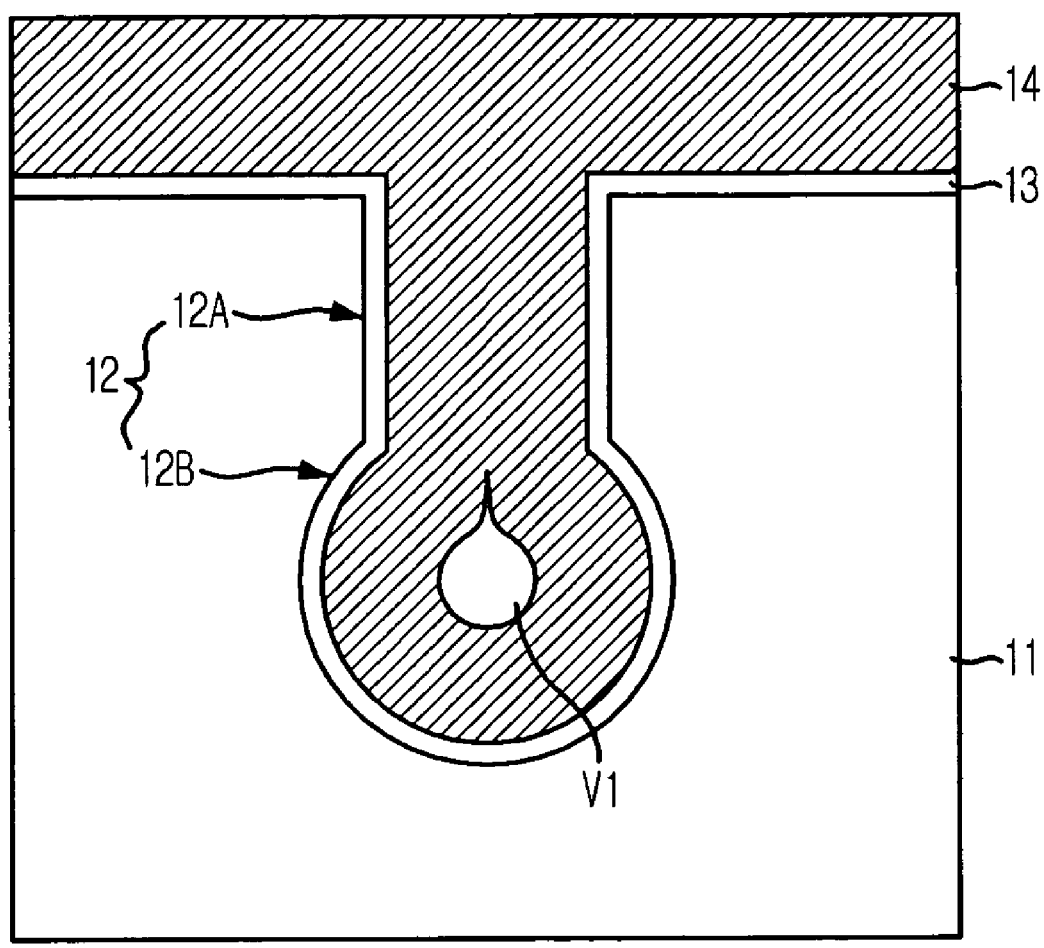
FIG. 1 illustrates a typical method for fabricating a bulb-shaped recess gate.
Figure 2A:
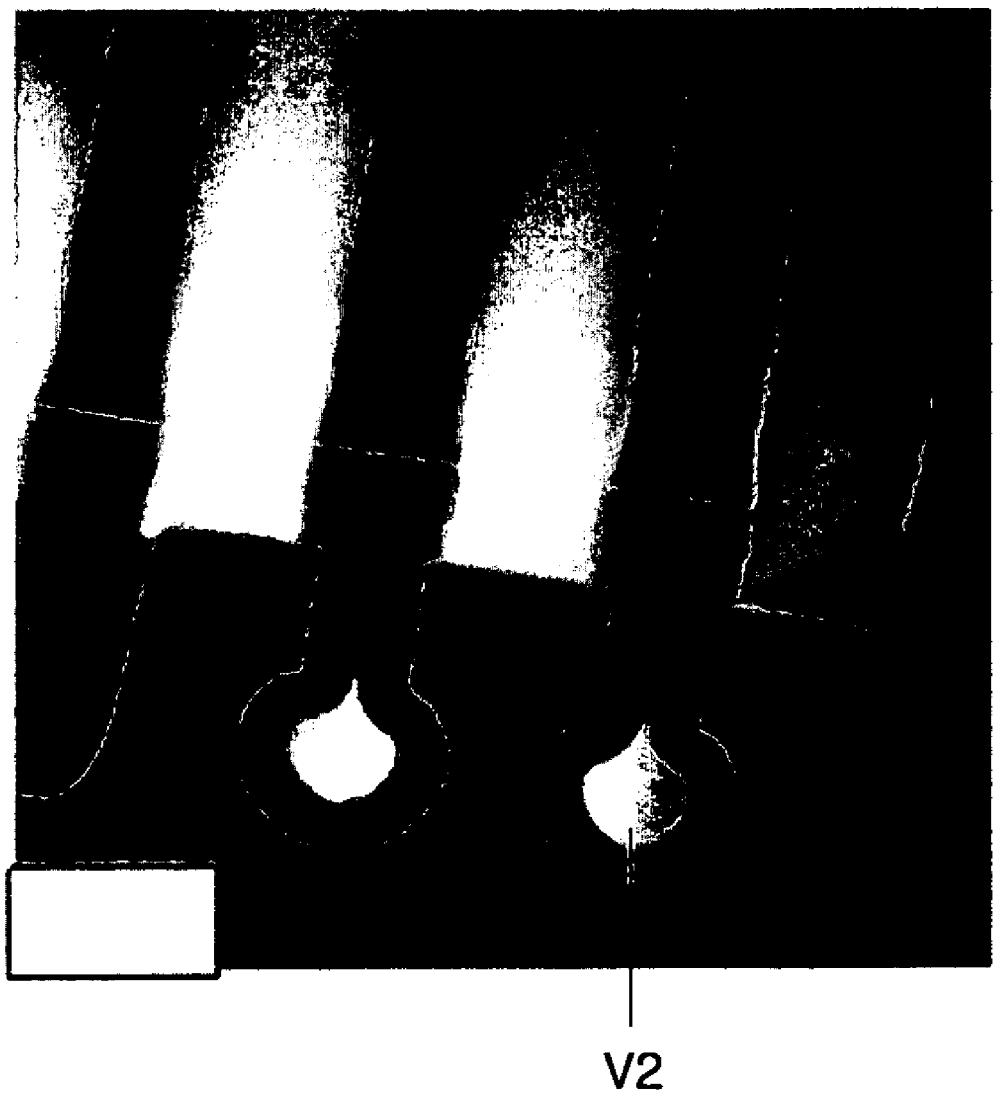
FIGS. 2A and 2B are micrographs illustrating a void typically generated during forming a polysilicon layer.
Figure 2B:
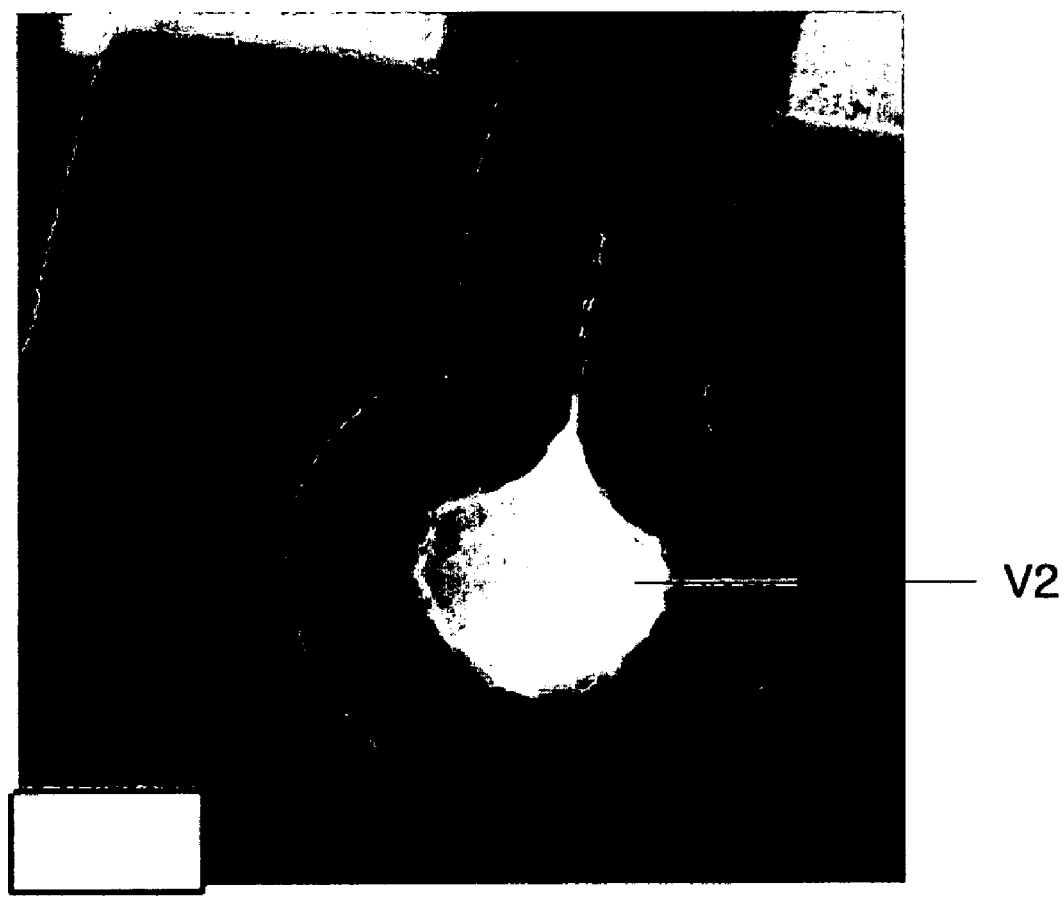

A size of a void V5 generated after forming the polysilicon layer is very small. Particularly, the size of void V5 shown in FIGS. 7A and 7B is much smaller than that of void V2 shown in FIGS. 2A and 2B. According to the first and second embodiments consistent with the present invention, by forming a first ball pattern in an elliptical shape, a size of a void V5 can be reduced.

According to the embodiments consistent with the present invention, a bulb-shaped recess pattern including ball patterns having different shapes and diameter from each other is formed in a gourd-shape. Accordingly, a size of a void generated during forming a polysilicon layer can be minimized.

The bulb-shaped recess pattern formed in the gourd shape can increase an area of the polysilicon layer and uniformly maintain a line width of a top portion thereof. Accordingly, an overlay margin between the top portion of the bulb-shaped recess pattern and a gate electrode cannot be reduced.

While the present invention has been described with respect to the specific embodiments, it will be apparent to those skilled in the art that various changes and modifications may be made without departing from the spirit and scope of the invention as defined in the following claims.

What is claimed is:

1. A recess gate of a semiconductor device, comprising:
   a substrate having a bulb-shaped recess pattern formed therein, the bulb-shaped recess pattern including a first ball pattern and a second ball pattern formed therein, the first ball pattern having a first diameter and the second ball pattern having a second diameter;
   a gate insulation layer formed over the bulb-shaped recess pattern and the substrate; and
   a conductive layer formed over the gate insulation layer and filling the bulb-shaped recess pattern.

2. The recess gate of claim 1, wherein the first diameter is smaller than the second diameter.

3. The recess gate of claim 2, wherein a shape of the first ball pattern is different from a shape of the second ball pattern.

4. The recess gate of claim 3, wherein the first ball pattern has an elliptical shape, and the second ball pattern has a spherical shape.

5. The recess gate of claim 1, wherein:
the gate insulation layer includes an oxide-based material; and
the conductive layer includes polysilicon.

6. A method for fabricating a recess gate of a semiconductor device, the method comprising:
forming a bulb-shaped recess pattern in a substrate, wherein forming the bulb-shaped recess pattern comprises:
forming a first ball pattern to have a first diameter in the substrate; and
forming a second ball pattern to have a second diameter in the substrate;
forming a gate insulation layer over the bulb-shaped recess pattern and the substrate; and
forming a conductive layer over the gate insulation layer such that the conductive layer substantially fills the bulb-shaped recess pattern.

7. The method of claim 6, wherein the first diameter is smaller than the second diameter.

8. The method of claim 6, wherein forming the bulb-shaped recess pattern further comprises:
forming the first ball pattern to have a first shape; and
forming the second ball pattern to have a second shape different from the first shape.

9. The method of claim 8, wherein the first shape comprises an elliptical shape, and the second shape comprises a spherical shape.

10. The method of claim 9, wherein forming the bulb-shaped recess pattern further comprises:
etching the substrate to a certain depth to form a neck pattern having vertically aligned sidewalls;
etching the neck pattern to form the first ball pattern; and
etching a bottom portion of the first ball pattern to form the second ball pattern.

11. The method of claim 10, wherein etching the substrate to form the neck pattern and etching the neck pattern to form the first ball pattern are performed in the same chamber.

12. The method of claim 11, wherein etching the neck pattern to form the first ball pattern and etching the bottom portion of the first ball pattern to form the second ball pattern each comprise performing etching at a power ranging from approximately 1 W to approximately 20 W, and a mixture gas of $CF_4$, $O_2$, and He as an etch gas.

13. The method of claim 12, wherein the mixture gas includes the $CF_4$ gas at a flow rate ranging from approximately 20 sccm to approximately 80 sccm, the $O_2$ gas at a flow rate ranging from approximately 5 sccm to approximately 10 sccm, and the He gas at a flow rate ranging from approximately 100 sccm to approximately 200 sccm.

14. The method of claim 10, wherein etching the substrate to form the neck pattern and etching the neck pattern to form the first ball pattern are performed in different chambers.

15. The method of claim 14, wherein etching the neck pattern to form the first ball pattern and etching the bottom portion of the first ball pattern to form the second ball pattern each comprise using a microwave dry etching apparatus.

16. The method of claim 15, wherein etching the neck pattern to form the first ball pattern and etching the bottom portion of the first ball pattern to form the second ball pattern each comprise using a mixture gas of $CF_4$, $O_2$, and He, wherein a flow rate of the $CF_4$ gas ranges from approximately 20 sccm to approximately 80 sccm; a flow rate of the $O_2$ gas ranges from approximately 5 sccm to approximately 10 sccm; and a flow rate of the He gas ranges from approximately 100 sccm to approximately 200 sccm.

17. The method of claim 10, wherein etching the substrate to form the neck pattern includes using an inductively coupled plasma (ICP) type etching apparatus.

18. The method of claim 6, wherein forming the gate insulation layer comprises using an oxide-based material, and forming the conductive layer comprises using polysilicon.

19. The method of claim 10, wherein etching the neck pattern and etching the bottom portion of the first ball pattern comprises performing an isotropic etching process.

* * * * *